United States Patent
Matsuno

(10) Patent No.: US 6,265,671 B1
(45) Date of Patent: *Jul. 24, 2001

(54) PRINTED-WIRING BOARD AND A PRODUCTION METHOD THEREOF

(75) Inventor: Yukio Matsuno, Osaka (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,203

(22) Filed: Jun. 18, 1997

(30) Foreign Application Priority Data

Jul. 9, 1996 (JP) .................................... 8-178993

(51) Int. Cl.$^7$ ..................................... H05K 1/03
(52) U.S. Cl. ..................... 174/255; 174/258; 174/261; 257/723; 361/772
(58) Field of Search .................. 174/250, 255, 174/258, 261, 262; 361/772, 773, 774; 257/723, 724

(56) References Cited

U.S. PATENT DOCUMENTS

| | | |
|---|---|---|
| 4,740,700 | 4/1988 | Shaham et al. . |
| 5,153,051 | * 10/1992 | Dorinski .......................... 174/250 X |
| 5,243,142 | 9/1993 | Ishikawa et al. . |
| 5,252,195 | * 10/1993 | Kobayashi et al. ................... 205/126 |
| 5,478,972 | * 12/1995 | Mizutani et al. .................... 174/250 |

FOREIGN PATENT DOCUMENTS

| | | |
|---|---|---|
| 4125879A1 | 2/1992 | (DE) . |
| 0622980A1 | 4/1993 | (EP) . |
| 0602610A1 | 6/1994 | (EP) . |
| 1-120891 | * 5/1989 | (JP) . |
| 7-326844 | * 12/1995 | (JP) . |
| 8064968 | 8/1996 | (JP) . |

OTHER PUBLICATIONS

Patent Abstracts of Japan, vol. 13., No. 248 (E–770) Jun. 9, 1989, JP 01 048437A (Feb. 22, 1989).

* cited by examiner

Primary Examiner—Albert W. Paladini

(57) ABSTRACT

A printed-wiring board has a copper foil (the first conductive layer) providing electric conductivity formed on one or both sides of an insulating board providing electrical insulation, an insulating layer providing electrical insulation formed at specific sites (where there are through-holes) on the first conductive layer, and a second conductive layer providing electric conductivity formed on the insulating layer. In this printed-wiring board, when the second conductive layer is formed, deposition of an electrically conductive material by plating, and polishing of the deposited electrically conductive material, these steps are repeated at least once, so that the surface of the second conductive layer can be smoothened to enhance the bonding stability of chip parts.

6 Claims, 9 Drawing Sheets

PRINTED-WIRING BOARD AND A PRODUCTION METHOD THEREOF

BACKGROUND OF THE INVENTION (1) Field of the Invention

The present invention relates to a structure and production method of a multi-layer printed-wiring board produced by a so-called buildup process which comprises the steps of: forming a first conductive layer providing electric conductivity on one or both sides of an insulating substrate providing electrical insulation; forming another insulating layer providing electrical insulation at specific sites on the first conductive layer (e.g., a through-hole); and covering the insulating layer with another conductive layer providing electric conductivity.

(2) Description of the Prior Art

So-called conventional buildup type printed-wiring boards which are formed by providing insulating layers and/or conductive layers on a previously formed, layered printed-wiring board have been well known.

However, the well-known buildup configuration is a general one and does not include the techniques such as the so-called chip-on-hole.

The chip-on-hole technique is to produce a printed-wiring board which is formed by plating with copper etc., on a through-hole, or so-called inner via-hole for connecting only between the layers, and coating with solder or the like on the plating.

This method allows chip components to be mounted on a solder paste etc. which has been printed on the plating for plugging holes. In other words, it is impossible to mount a chip component on a through-hole unless the through-hole is plugged up by plating.

As seen in the above, a printed-wiring board formed by using the chip-on-hole technique has reduced its substrate size compared to a printed-wiring board which has the same functionality but was formed by other than the chip-on-hole technique. In other words, if the equally sized print-wiring board is produced, the print-wiring board using the chip-on-hole technique can be improved more in its functionality than the printed-wiring board which was formed by other than the chip-on-hole technique. Briefly, the printed-wiring board using the chip-on-hole technique is one which can make the product compact and light-weight.

The production method of a buildup multi-layer printed-wiring board of such a chip-on-hole makeup will be described with reference to FIGS. 1 through 7.

As the substrate, an insulating plate 51 with copper foils 52, 52 applied on both sides thereof is prepared (cf. FIG. 1). Insulating plate 51 is usually 0.1–1.6 mm in thickness and is made from glass epoxy resin, in general. The thickness of copper foil 52 is generally 9–18 µm.

Next, a double-sided printed-wiring board is produced by a general copper through-hole tenting technique. FIG.2 shows the double-sided printed-wiring board thus produced. In this figure, reference numerals 53 and 54 designate through-holes both being provided with copper plate 55 therein. The thickness of copper plate 55 is appropriately 15–20 µm.

Through-hole 53 is an ordinary one which has both the functions of signal communication and mounting a discreet part. Through-hole 54 is one which is dedicatedly used for signal communication. Therefore, the inside diameter of through-hole 54 is not limited in size and can be designed as small as possible, whereas the inside diameter of through-hole 53 is limited as to its minimum size by the size of the lead of the discreet part.

Reference numerals 56 and 57 in the figure designate a solder resist and a conductive portion, respectively.

Next, in order to form an insulating resin layer over through-hole 54 in the thus completed double-sided printed-wiring board, an insulating layer 58 is formed by printing or a film deposition process. Insulating layer 58 is formed not only directly above through-hole 54 but also is formed so as to cover a peripheral portion thereof. As required, the resin applied is cured (see FIG. 3).

Next, insulating layer 58 thus formed is covered with an electroless copper plating 59 overlapping thereon. Areas which should not be subjected to the process for electroless copper plating 59 are provided with a plating resist (not shown) before the step, and then the plating resist is peeled off after the completion of electroless copper plating 59 (see FIG. 4). In this way, a buildup printed-wiring board is finished.

Then, a mounting step of chip parts is effected. Illustratively, solder paste 60 is printed on electroless copper plating 59 formed on through-hole 54 (see FIG. 5). Next, a chip part (not shown) is tacked on solder paste 60, then solder paste 60 is re-fused by solder-reflow to thereby mount the chip part on electroless copper plate 59.

The multi-layer printed-wiring plate of a buildup type thus produced can be manufactured at a low cost in a short period of time, and has no need to use a glass cloth as a connecting means, which was needed in the conventional multi-layer printed-wiring board using prepleg, and also has incidental effects such as excellent high-frequency characteristics.

However, the multi-layer printed-wiring board configured as above, has suffered from a problem of lack of smoothness on the surface of electroless copper plating 59, as is seen in FIG. 5. More clearly, as shown in an enlarged view in FIG. 6, the surface of electroless copper plating 59 has hollows or craters, presenting poor smoothness.

Primarily, the object of forming a plating layer (electroless copper plating 59) as a 'footing' on through-hole 54 only for communication of electric signals is to mount a chip part on the plating layer. Therefore, the plating layer poor in smoothness, directly results in poor stability of the chip part mounted thereon.

In practice, a chip part is rarely mounted directly on the plating layer; in most cases chip parts are mounted after providing solder paste 60 by printing or other methods and the providing them to be soldered by solder reflow, so that lack of the smoothness in the plating layer will not bring about direct instability in the connection of the chip parts.

Still, the printing process can be more easily performed if the surface to be printed with solder paste 60, that is, the surface of electroless copper plate 59 is of a greater smoothness. Also, the bonding stability of the chip part after solder reflow will be enhanced. In particular, with the evolution of chip parts to greater compactness, such as the appearance of a 1005 type (i.e., a chip part having a size of 1.0 mm ×0.5 mm), it is easily conceived that the smoothness of the printing surface on which the solder paste should be printed largely affects the connection stability of chip parts.

Products having printed-wiring boards which were prepared by these steps are often mishandled. For example, the products often encounter mechanical impacts such as being dropped or being struck.

Now, FIG. 7 is an enlarged view showing a state after a soldering process, where a chip part is mounted on a printed-wiring board. Solder paste 60 does not bond chip part 61 throughout the underside thereof but bonds it at the ends only. In some cases, the contact area is smaller than the above; the chip part may be bonded at one end thereof, as seen in the figure.

If products with chip parts bonded in this manner are dropped or struck, mechanical stress concentrates on this small bonded portion and thereby breaks it down, resulting in reduction of the reliability of the product.

SUMMARY OF THE INVENTION

The present invention has been devised to solve the above problems, and it therefore an object of the invention to provide a printed-wiring board and production method thereof wherein the connection stability of the chip parts on it can be improved.

To achieve the above object, in accordance with the first aspect of the invention, a printed-wiring board includes: an insulating substrate providing electrical insulation; a first conductive layer providing electric conductivity formed on one or both sides of the insulating substrate; an insulating layer providing electrical insulation formed at specific sites on the first conductive layer; and a second conductive layer providing electric conductivity formed on the insulating layer, and is constructed such that the top surface of the second conductive layer is provided with a smooth surface.

A printed-wiring board according to the second aspect of the invention includes: an insulating substrate providing electrical insulation; a first conductive layer providing electric conductivity formed on one or both sides of the insulating substrate; an insulating layer providing electrical insulation formed at specific sites on the first conductive layer; a second conductive layer providing electric conductivity formed on the insulating layer; and a third conductive layer formed on the second conducive layer, and is constructed such that the top surface of the third conductive layer is provided with a smooth surface.

A printed-wiring board according to the third aspect of the invention includes: an insulating substrate providing electrical insulation; a first conductive layer providing electric conductivity formed on one or both sides of the insulating substrate; a first insulating layer providing electrical insulation formed at specific sites on the first conductive layer; a second conductive layer providing electric conductivity formed on the first insulating layer; a second insulating layer providing electrical insulation formed on the second conductive layer; and a third conductive layer providing electric conductivity formed on the second insulating layer, and is constructed such that the top surface of the third conductive layer is provided with a smooth surface.

A method of producing a printed-wiring board according to the fourth aspect of the invention, includes the steps of: forming a first conductive layer providing electric conductivity on one or both sides of an insulating substrate providing electrical insulation; forming an insulating layer providing electrical insulation at specific sites on the first conductive layer; and forming a second conductive layer providing electric conductivity on the insulating layer, wherein when the second conductive layer is formed, deposition of an electrically conductive material by plating, and polishing of the deposited electrically conductive material, these steps being repeated at least once. Briefly, a step for polishing the plated surface is added so that plating and polishing are alternately carried out to reduce the irregularities on the plated surface deposited.

A method of producing a printed-wiring board according to the fifth aspect of the invention includes the steps of: forming a first conductive layer providing electric conductivity on one or both sides of an insulating substrate providing electrical insulation; forming an insulating layer providing electrical insulation at specific sites on the first conductive layer; forming a second conductive layer providing electric conductivity on the insulating layer; and forming a third conductive layer on the second conducive layer, wherein the second conductive layer is formed by forming deposition of an electrically conductive material by plating and the third conducive layer is formed on the second conductive layer by screen printing. Briefly, hollows on the second conductive layer is filled up to be of a smooth surface before the subsequent step, i.e., a solder paste providing step. In this case, since it is necessary to ensure good wettability with solder during fusing solder paste in the subsequent step, at least the surface is needed to be formed of an electrically conductive material. Therefore, in this invention, hollows on the second conductive layer are filled up with the third conductive layer to thereby reduce irregularities on the surface (of the third conductive layer).

A method of producing a printed-wiring board according to the sixth aspect of the invention includes the steps of: forming a first conductive layer providing electric conductivity on one or both sides of an insulating substrate providing electrical insulation; forming a first insulating layer providing electrical insulation at specific sites on the first conductive layer; forming a second conductive layer providing electric conductivity on the first insulating layer; forming a second insulating layer providing electrical insulation on the second conductive layer; and forming a third conductive layer providing electric conductivity on the second insulating layer, wherein the second conductive layer is formed by forming deposition of an electrically conductive material by plating, the second insulating layer is formed on the second conductive layer by screen printing, and the third conductive layer is formed on the second insulating layer by plating. Briefly, hollows on the first insulating layer is filled up to be of a smooth surface before the subsequent step, i.e., a solder paste providing step. In this case, since it is necessary to ensure good wettability with solder during fusing solder paste in the subsequent step, at least the surface is needed to be formed of an electrically conductive material. Therefore, in this invention, hollows on the second conductive layer are first filled up with the second insulating layer and then these are further provided with the third conductive layer to thereby reduce irregularities on the surface (of the third conductive layer).

DESCRIPTION OF THE PREFERRED EMBODIMENTS

The embodiments of the present invention will hereinafter be described with reference to the accompanying drawings.

FIGS. 8 through 12 show the first embodiment of the invention.

A method of producing a multi-layer printed-board of a chip-on-hole makeup by using a buildup technique is effected as follows:

As the substrate, an insulating plate 1 with copper foils 2, 2 applied on both sides thereof is prepared (cf.

Figure 8:
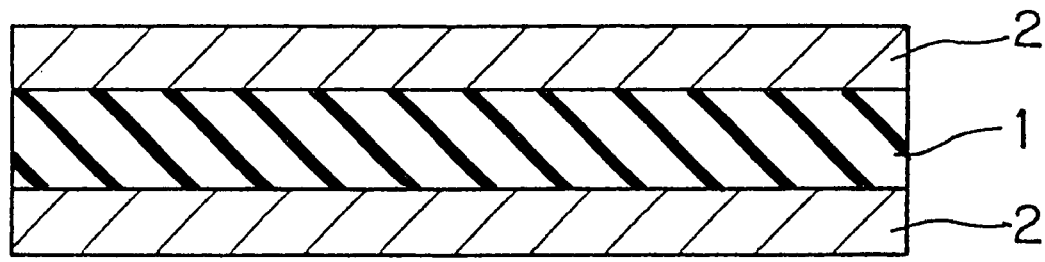
FIGS. 8 through 12 are illustrations for explaining a method of producing a multi-layer printed-wiring board of a chip-on-hole makeup by using a buildup technique, in accordance with the first embodiment of the invention.

FIG. 8). Insulating plate 1 is usually 0.1–1.6 mm in thickness and is made from glass epoxy resin, in general. The thickness of copper foil 2 is generally 9–18 $\mu$m.

Figure 9:
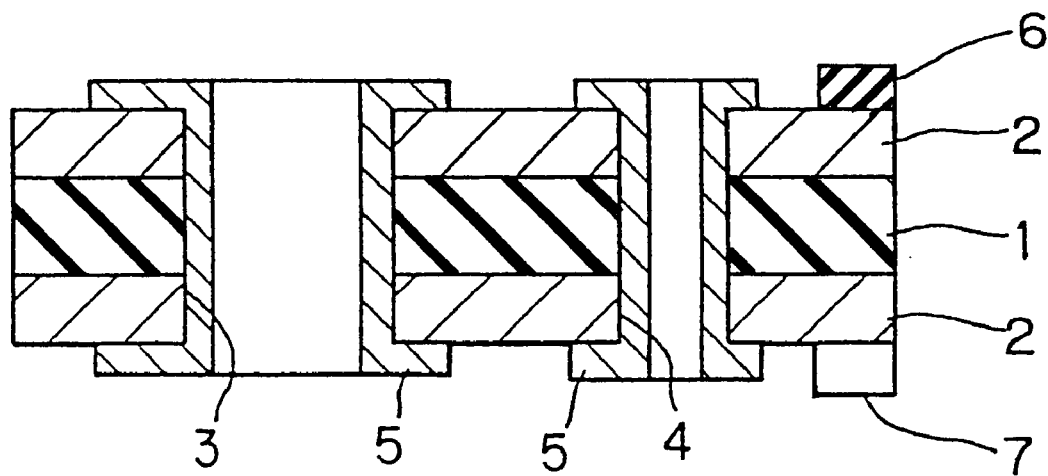
Figure 10:
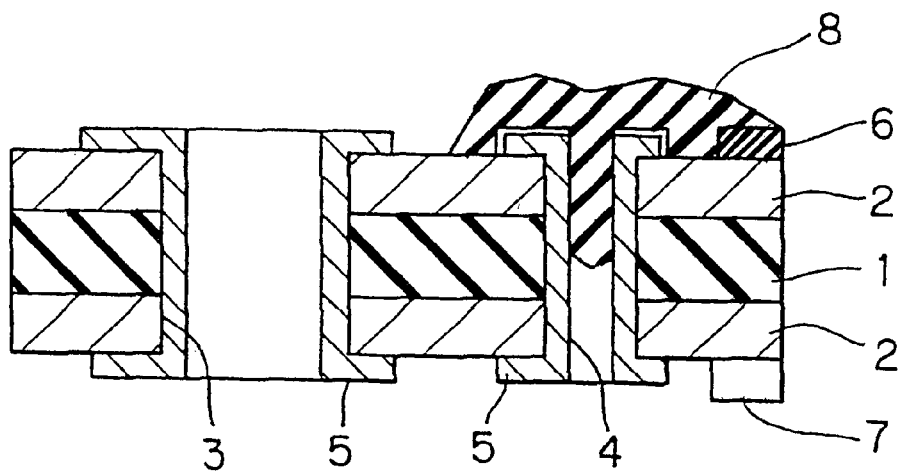

Next, a double-sided printed-wiring board is produced by a general copper through-hole tenting method. FIG. 9 shows the double-sided printed-wiring board thus produced. In this figure, reference numerals 3 and 4 designate through-holes both being provided with copper plate 5 therein. The thickness of copper plate 5 is appropriately 15–20 $\mu$m.

Through-hole 3 is an ordinary one which has both the functions of signal communication and mounting a discreet part. Through-hole 4 is one which is dedicatedly used for signal communication. Therefore, the inside diameter of through-hole 4 is not limited in size and can be designed as small as possible, whereas the inside diameter of through hole 3 is limited as to its minimum size by the size of the lead of the discreet part.

Reference numerals 6 and 7 in the figure designate a solder resist and a conductive portion, respectively.

Next, in order to form an insulating resin layer over through-hole 4 in the thus completed double-sided printed-wiring board, an insulating layer 8 is formed by printing or a film deposition process. Insulating layer 8 is formed not only directly above through-hole 4 but also is formed so as to cover a peripheral portion thereof. As required, the resin applied is cured (see FIG. 10).

Figure 1:
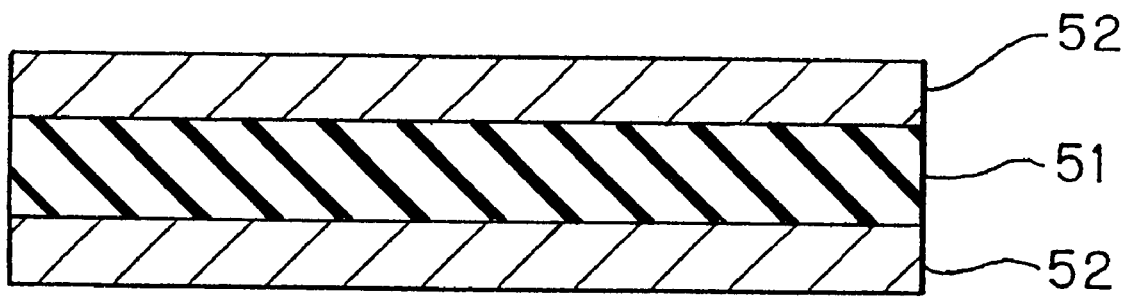
FIGS. 1 through 5 are illustrations for explaining a conventional method of producing a multi-layer printed-wiring board of a chip-on-hole makeup by using a buildup technique.
Figure 2:
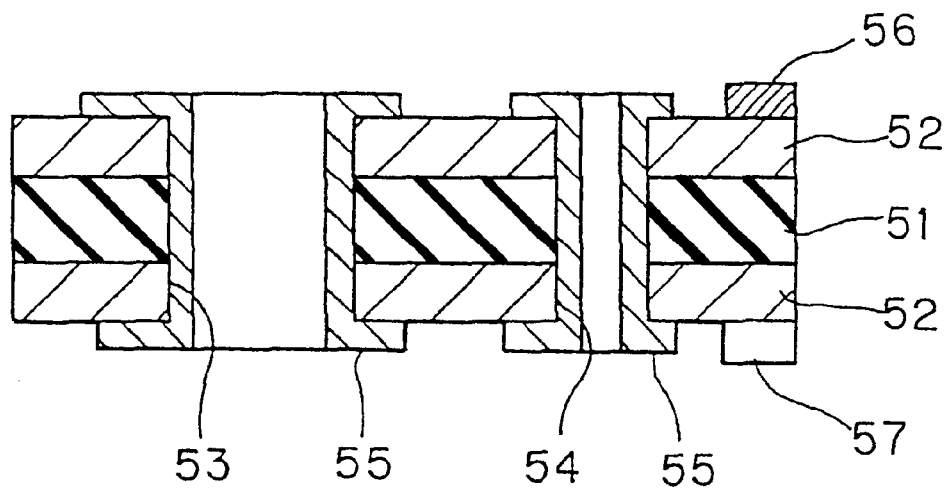
Figure 3:
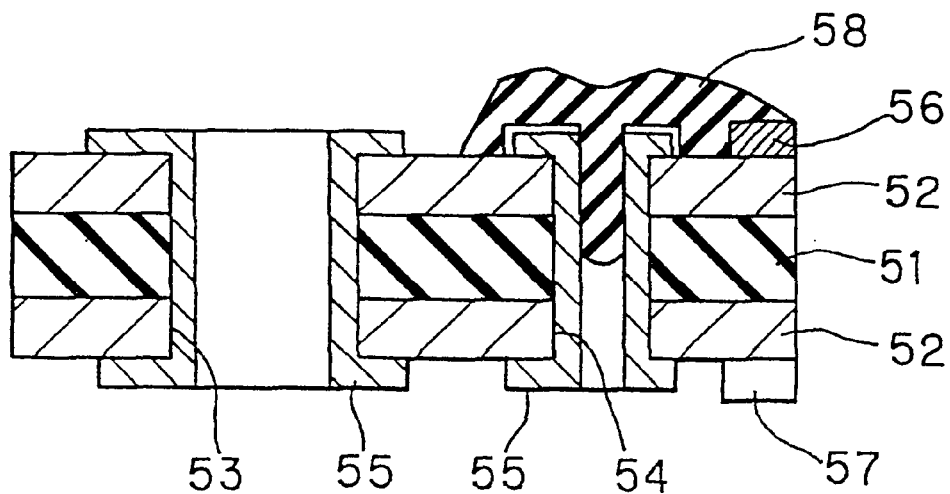
Figure 4:
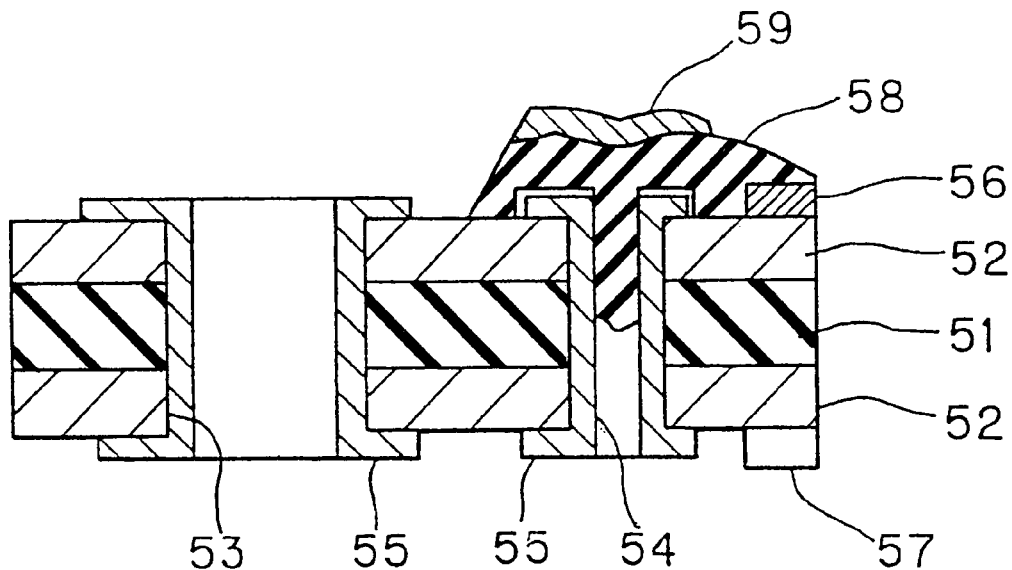
Figure 5:
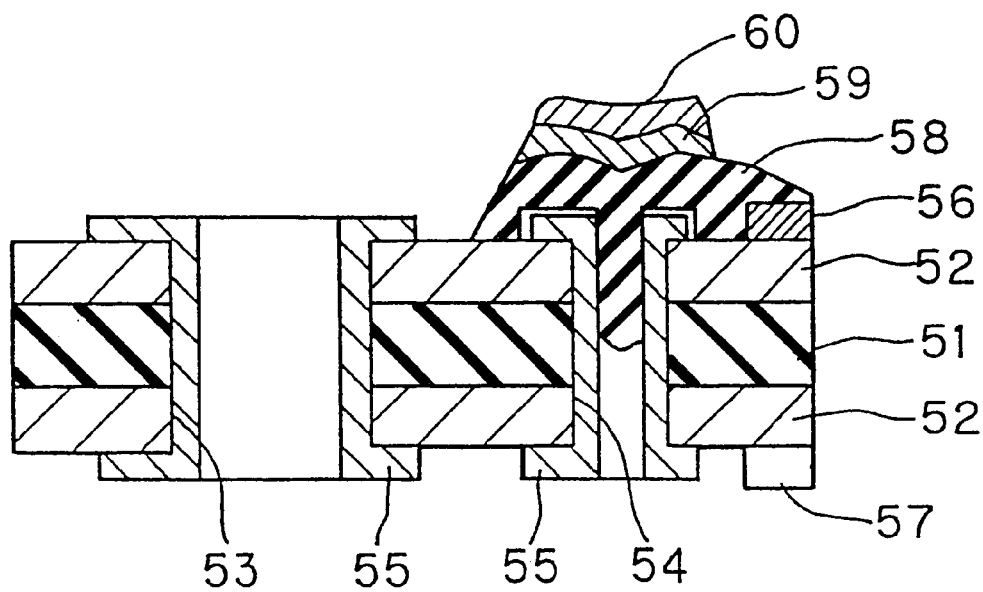
Figure 6:
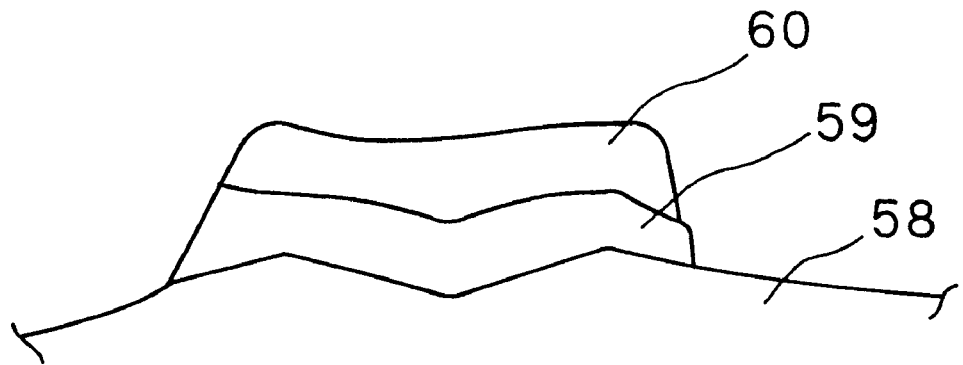
FIG. 6 is an enlarged view showing an electroless copper plating portion in a multi-layer printed-wiring board produced by a conventional production method.
Figure 7:
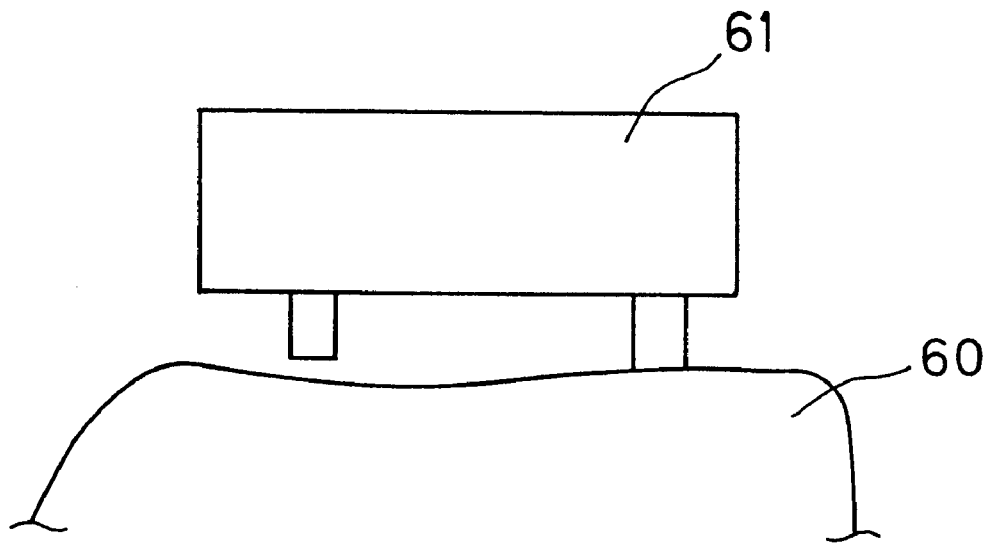
FIG. 7 is a partially enlarged view showing a state where a chip part is mounted on a printed-wiring board after a soldering process.

The process up to this point is the same as in the steps illustrated in the conventional art (the steps shown in FIGS. 1–3).

Next, insulating layer 8 thus formed is covered with an electroless copper plating 9 overlapping thereon. Areas which should not be subjected to the process for electroless copper plating 9 are provided with a plating resist (not shown) before the step, and then the plating resist is peeled off after the completion of electroless copper plating 9 (see FIG. 9).

The thus obtained electroless copper plating 9 is polished. Illustratively, the surface is smoothened by abrading projections using abrasive grain under oscillation (horizontal vibration), or by removing projections using a water-resistant abrasive paper (see FIG. 10). After this primary polishing, the surface is further coated with electroless copper plating 9, followed by another polishing. In this way, the electroless plating step and the polishing step are repeated.

When the electroless plating and polishing steps have been finished, the multi-layer printed-wiring plate of buildup structure is completed.

Figure 11:
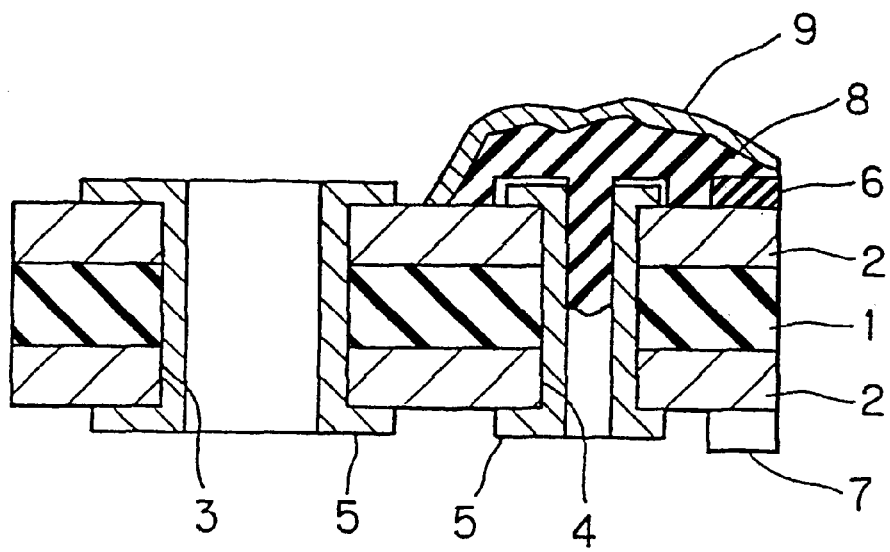
Figure 12:
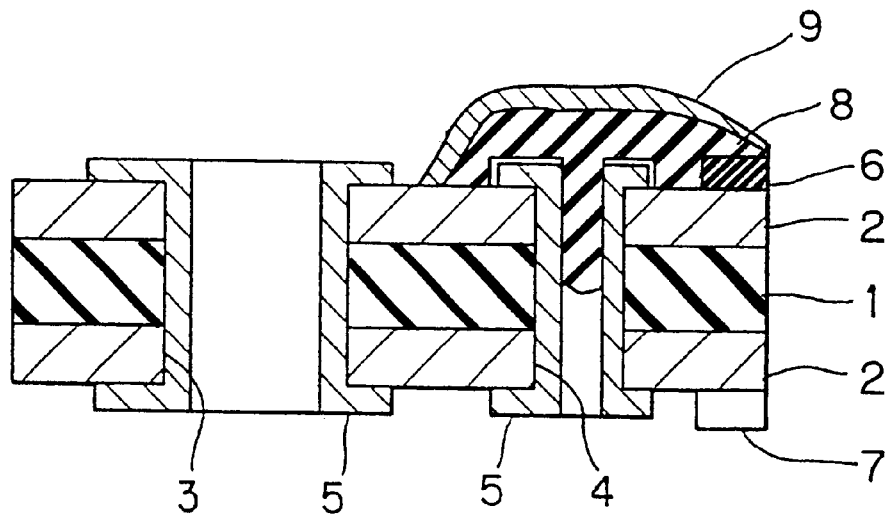

FIGS. 11 and 12 shows the second embodiment of the invention. Since the operation before FIG. 12 is the same as these steps shown in FIGS. 8 through 11, the description of the steps shown in FIGS. 8 to 11 is not repeated and the operation after FIG. 12 will be described. A third conductive layer 10 consisting of an electrically conductive material is applied onto the electroless copper plating (the second conductive layer) 9 formed in the step shown in FIG. 11, by a screen printing process.

Used as the third conductive layer 10 is a copper paste which is mainly composed of copper mixed with an epoxy resin paste as a secondary component so as to be of correct impedance. This copper paste as the third conducive layer 10 alleviates irregularities on the surface of electroless copper plating 9, making it possible to form a smooth surface.

Figure 14:
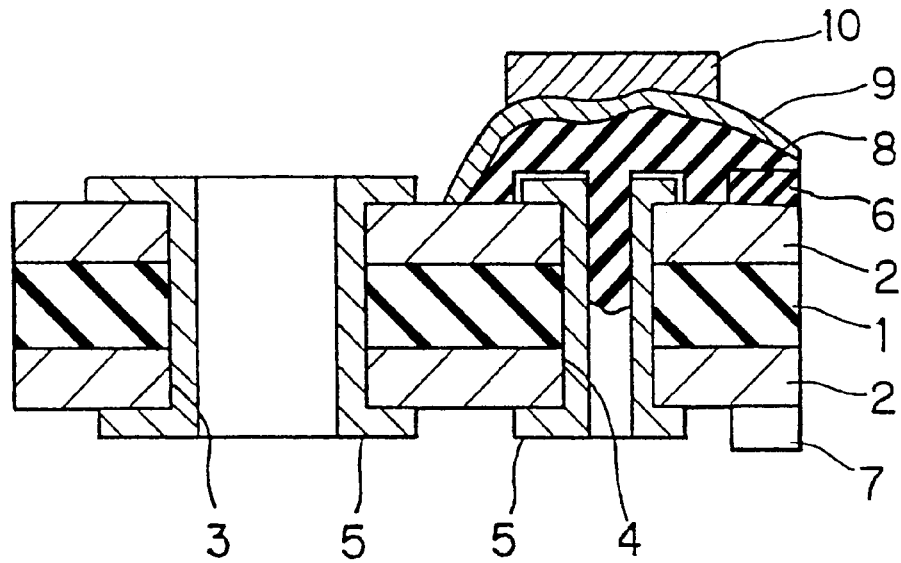

Then, the copper paste applied is thermally cured, thus completing a printed-wiring board with the chip-mounting site smoothed as shown in FIG. 14.

Figure 13:
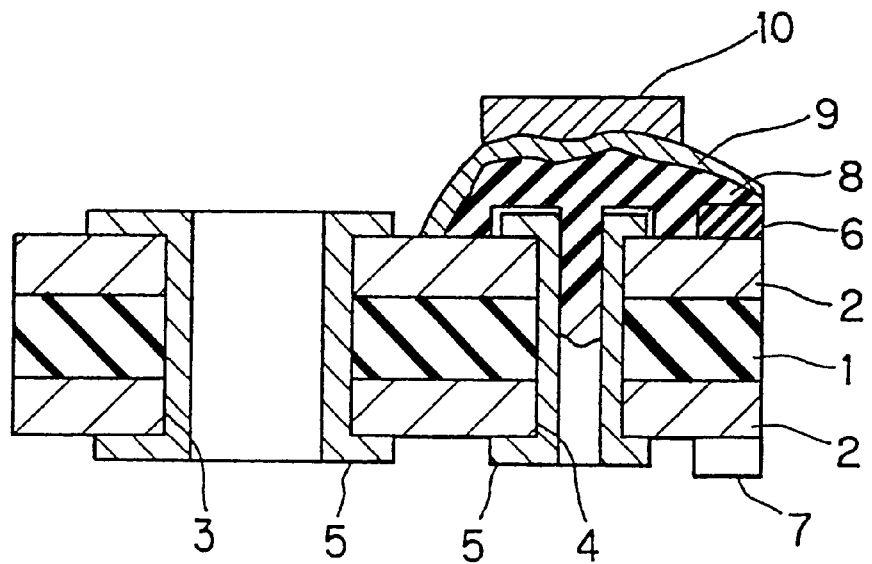
FIGS. 13 and 14 are illustrations for explaining a method of producing a multi-layer printed-wiring board of a chip-on-hole makeup by using a buildup technique, in accordance with the second embodiment of the invention.
Figure 15:
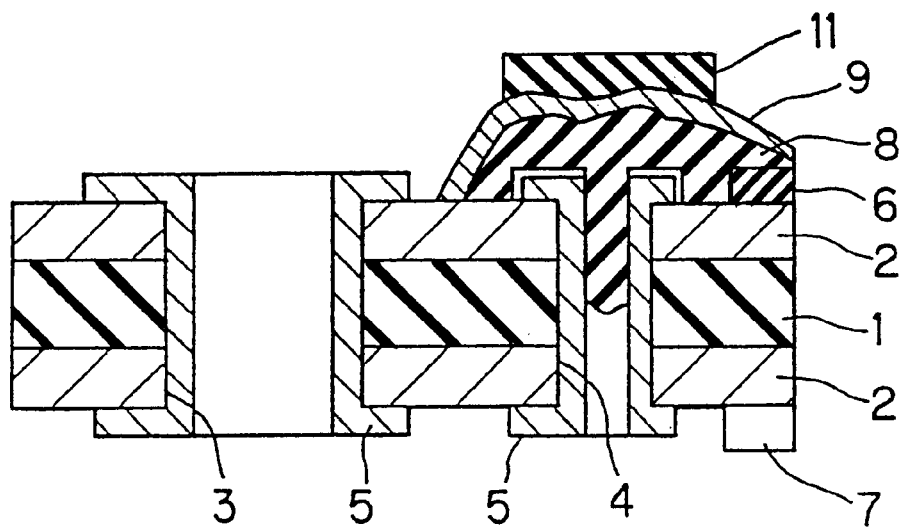
FIGS. 15 and 16 are illustrations for explaining a method of producing a multi-layer printed-wiring board of a chip-on-hole makeup by using a buildup technique, in accordance with the third embodiment of the invention.
Figure 16:
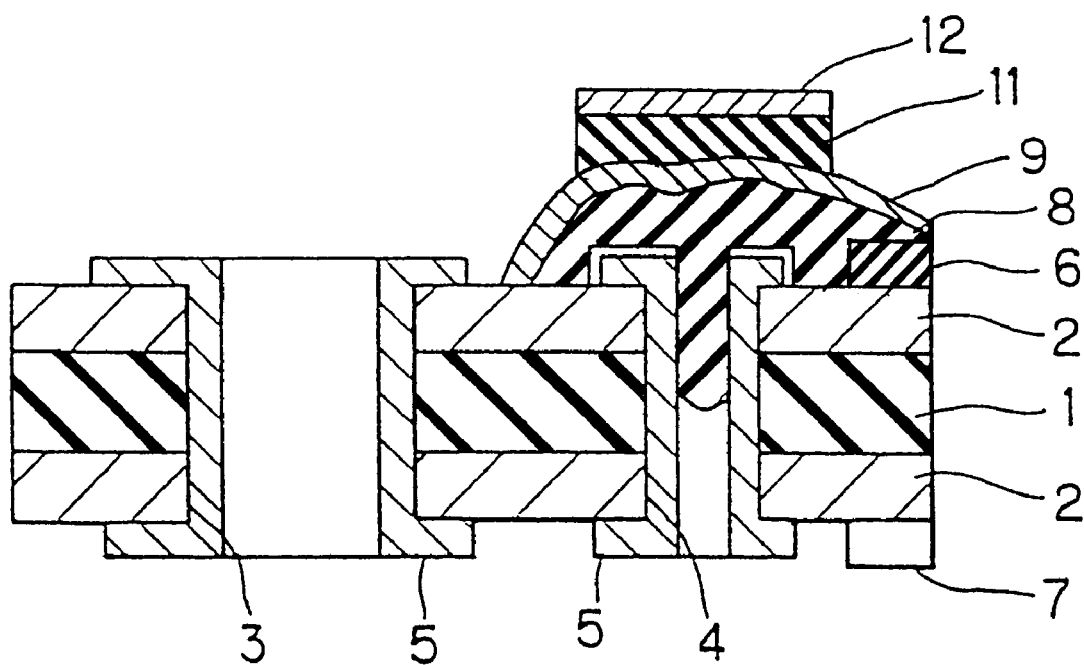

FIGS. 15 and 16 shows the third embodiment of the invention. Since the operation before FIG. 15 is the same as the steps shown in FIGS. 8 through 11, the description of the steps shown in FIGS. 8 to 11 is not repeated and the operation after FIG. 13 will be described.

A second insulating layer 11 consisting of an electrically insulating material is applied onto the electroless copper plating (the second conductive layer) 9 formed in the step shown in FIG. 11.

As an example of the second insulating layer 11, epoxy resin is an appropriate choice judging from its electric and mechanical characteristics. This second insulating layer 11 is thermally cured.

Next, another electroless copper plating (the third conductive layer) 12 is applied on the second insulating layer 11 thus cured. In this case, since the bed (the surface of the second insulating layer 11) on which electroless copper plating 12 is to be applied is smooth, no polishing on the surface of electroless copper plating 12 is needed. Thus, as electroless copper plating 12 is finished, the multi-layer printed-wiring plate of buildup structure is completed as shown in FIG. 16.

The printed-wiring board includes: an insulating substrate providing electrical insulation; a first conductive layer providing electric conductivity formed on one or both sides of the insulating substrate; an insulating layer providing electrical insulation formed at specific sites on the first conductive layer; and a second conductive layer providing electric conductivity formed on the insulating layer, and the top surface of the second conductive layer is provided with a smooth surface. Also, a third conductive layer may be formed on the second conducive layer, and the top surface of the third conductive layer is provided with a smooth surface. Further, a second insulating layer providing electrical insulation may be formed on the second conductive layer, and a third conductive layer providing electric conductivity is formed on the second insulating layer, and the top surface of the third conductive layer is provided with a smooth surface.

The method of producing a printed-wiring board of the invention includes the steps of: forming a first conductive layer providing electric conductivity on one or both sides of an insulating substrate providing electrical insulation; forming an insulating layer providing electrical insulation at specific sites on the first conductive layer; and forming a second conductive layer providing electric conductivity on the insulating layer. In this method, when the second conductive layer is formed, deposition of an electrically conductive material by plating, and polishing of the deposited electrically conductive material, these steps being repeated at least once. Further, in the method of producing a printed-wiring board including the steps of: forming a second conductive layer providing electric conductivity on the insulating layer; and forming a third conductive layer on the second conducive layer, the second conductive layer is formed by forming deposition of an electrically conductive material by plating, and the third conducive layer is formed on the second conductive layer by screen printing. Furthermore, in the method of producing a printed-wiring board including the steps of: forming a second conductive layer providing electric conductivity on the first insulating layer; forming a second insulating layer providing electrical insulation on the second conductive layer; and forming a third conductive layer providing electric conductivity on the second insulating layer, the second conductive layer is formed by forming deposition of an electrically conductive material by plating, the second insulating layer is formed on the second conductive layer by screen printing, and the third conductive layer is formed on the second insulating layer by plating.

Accordingly, when a through-holes is formed at specific sites in the first conductive layer, the lands above the through-hole are smoothened so that chip parts can be soldered to the printed-wiring board throughout the whole soldering portion, securing a high contact between the chip parts and the printed-wiring board. As a result, even if the product receives external mechanical impacts etc., no chip parts will drop out, thus making it possible to improve the reliability of the product. Further, since the solder contacting performance between the chip parts and the printed-wiring board is enhanced, it is possible to make the chip parts compact in order to deal with the development of high-performance products having high-frequency characteristics.

What is claimed is:

1. A printed-wiring board comprising:

an insulating substrate providing electrical insulation;

a first conductive layer providing electric conductivity formed on one or both sides of the insulating substrate;

a first insulating layer providing electerical insulation formed at specific sites on the first conductive layer and the specific sites are only in the area of a through hole;

a second conductive layer providing electric conductivity formed on the first insulating layer;

a second insulating layer providing electrical insulation formed on the second conductive layer; and a third conductive layer providing electric conductivity formed on the second insulating layer, wherein the top surface of the third conductive layer is provided with a smooth surface, so that the third conductive layer has reduced irregularities on its surface, wherein the first insulating layer is formed over the through hole, so as to partially fill the through hole.

2. The printed-wiring board in accordance with claim 1 wherein the third conductive layer is copper with epoxy, so as to provide a correct impedance and reduce irregularities in the second conductive layer.

3. The printed-wiring board according to claim 1 wherein the first conductive layer is formed on both sides of the insulating substrate and the through hole is conductively plated to electrically interconnect portions of the first conductive layer on both sides of the insulating substrate to each other; and a portion of the insulating layer is located in the conductively plated through the hole.

4. The printed-wiring board in accordance with claim 1, wherein the second insulating layer is a cured epoxy resin.

5. The printed-wiring board in accordance with claim 1, wherein a chip component is mounted on the top surface of the third conductive layer with the smooth surface.

6. The printed-wiring board of claim 5 wherein the chip has a size of 1.0 mm×0.5 mm.

* * * * *